FREQUENCY CONVERTER FOR AM-FM RECEIVERS

Filed Aug. 28, 1948

INVENTOR
BENJAMIN S. VILKOMERSON
BY Philip G. Cooper
ATTORNEY

Patented June 24, 1952

2,601,475

UNITED STATES PATENT OFFICE 2,601,475

FREQUENCY CONVERTER FOR AM-FM RECEIVERS

Benjamin S. Vilkomerson, Camden, N. J., assignor to Radio Corporation of America, a corporation of Delaware Application August 28, 1948, Serial No. 46,594

8 Claims. (Cl. 250—20)

Figure 1:
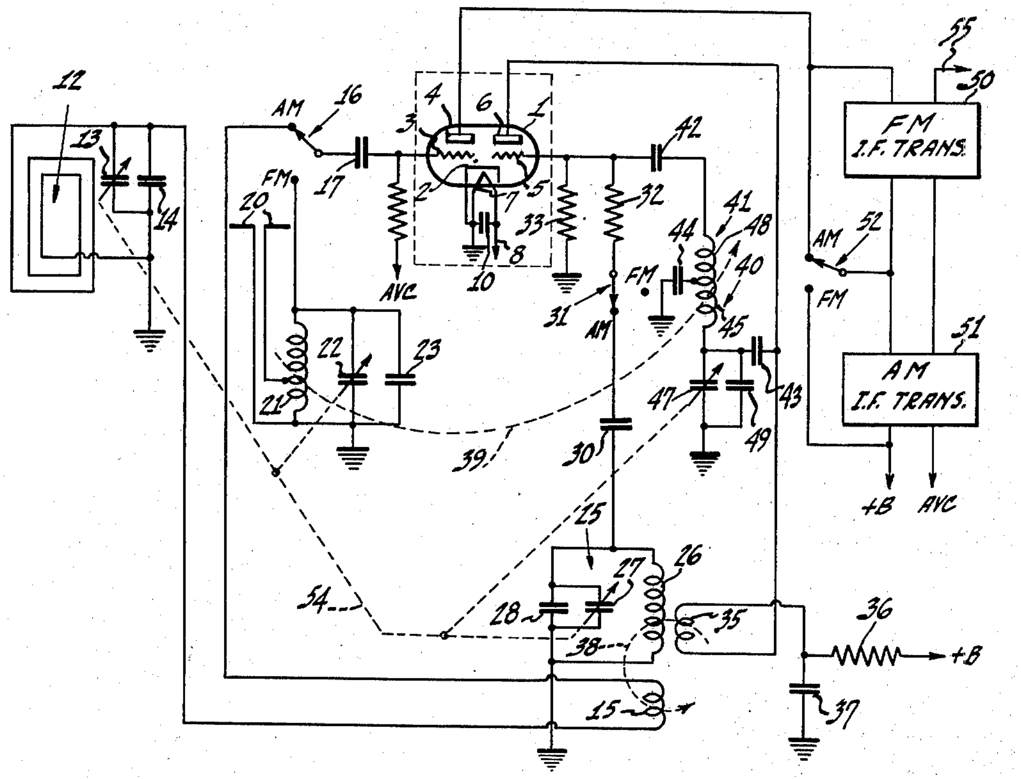

This invention relates generally to frequency converters and particularly to an oscillator and mixer circuit for a combined frequency-modulated (FM) and amplitude-modulated (AM) carrier wave receiver of the superheterodyne type.

It is conventional practice to provide a frequency converter for a superheterodyne receiver which has an oscillator section electronically coupled to the mixer section. Usually, a frequency converter of this type includes a pentagrid tube. It is well known, however, that a pentagrid converter tube has a high noise level, particularly when operated at the high frequencies encountered in the reception of FM waves. It is also well known that the signal-to-noise ratio of a receiver can be considerably improved either by utilizing a separate radio-frequency amplifier ahead of the mixer or by providing a triode mixer tube, since a triode inherently has a low noise level at high frequencies. Accordingly, frequency converters have been designed which consist of a triode oscillator and a triode mixer tube.

In order to inject the oscillatory energy into the mixer tube and for other reasons it is conventional practice to provide an impedance element between the mixer cathode and ground so that the cathode is operated at a radio frequency potential above ground. Such a circuit design, however, introduces certain other disadvantages. Thus, due to the inherent and unavoidable capacitive coupling between the two triodes, body capacitance on the antenna of the receiver will detune the oscillator to such an extent that the receiver will not receive a given station without retuning. The cathode of the oscillator is also conventionally operated at a radio frequency potential above ground. Hence, the capacitance existing between the cathode heater and the cathode of the oscillator may vary and this in turn may cause the frequency of the oscillator to drift. Also, the cathode heater may vibrate mechanically which will cause an undesired hum modulation of the oscillator frequency. In accordance with the present invention these and other disadvantages of previously known oscillator and mixer circuits can be overcome by grounding the cathodes of both the triode oscillator and the triode mixer. Such an arrangement will eliminate the frequency drift which would otherwise be caused by the varying capacity between the heater and the cathode of the oscillator because the cathode and the heater will be at the same potential. Furthermore, the choke coils conventionally required in the cathode heater supply are made superfluous. Furthermore, by grounding the cathodes of both the mixer and the oscillator tube, it is feasible to utilize a twin triode of the 6J6 type having a single cathode in common to the two triode sections. Such a tube is cheaper than a twin triode having two separate cathodes. Furthermore, the common cathode acts as an electrostatic shield between the two grids of the twin triode.

An efficient frequency converter circuit for a combined AM-FM receiver should also meet some further requirements. Thus, high frequency (FM) carrier waves should be suppressed before they can reach the mixer grid when the converter is used for receiving low frequency (AM) waves. Such high frequency waves may beat with a harmonic of the low frequency oscillator to produce an undesired intermediate-frequency wave. Furthermore, radiation of the oscillatory energy should be minimized. Finally, the oscillatory energy developed by the oscillator should be of uniform amplitude over the desired frequency ranges, and this energy should be injected efficiently into the mixer tube so that the oscillatory energy required is a minimum. This is, of course, in line with the requirement that the oscillatory energy should not be radiated into space by the antenna.

It is the prinicpal object of the present invention, therefore, to provide a novel oscillator and mixer circuit for a superheterodyne receiver which utilizes a twin triode tube having a common cathode or cathode circuit for the two triode sections thereby to improve the signal-to-noise ratio and to simplify the design of a superheterodyne receiver.

A further object of the invention is to provide a local oscillator for a superheterodyne receiver which will develop oscillatory energy of substantially uniform magnitude over two widely separated frequency ranges.

Another object of the invention is to provide an oscillator and mixer circuit for an AM-FM receiver where radiation of the oscillatory energy is minimized without the use of a radio-frequency amplifier stage and where a low pass filter is effectively provided between the antenna and the mixer input circuit for AM operation without the necessity of utilizing additional circuit elements.

Still a further object of the invention is to provide a simplified oscillator and mixer circuit for an AM-FM superheterodyne receiver which will have an improved performance and which minimizes frequency drift of the oscillator due to variations of the capacitance between the cathode heater and the cathode.

A frequency converter in accordance with the present invention includes a triode oscillator and a triode mixer each having a grounded cathode. Preferably a twin triode is used with a common grounded cathode. The oscillator section comprises for AM operation a tuned-grid tank circuit with an anode feed-back coil. The oscillatory energy is injected into the mixer grid by an inductance element inductively coupled to the tank circuit and serially connected between the AM antenna and the mixer grid.

For FM operation, the oscillator consists of a modified Colpitts circuit which includes a portion of the oscillator coil between the tank circuit and the oscillator grid. A circuit of this type will have substantially uniform output energy over the required frequency range. The FM oscillator tank circuit is inductively coupled to a tuned input circuit provided between the FM dipole antenna and the mixer grid. During FM operation the anode feed-back coil in the AM oscillator plate circuit functions as a choke coil for the anode voltage supply.

Figure 1A:
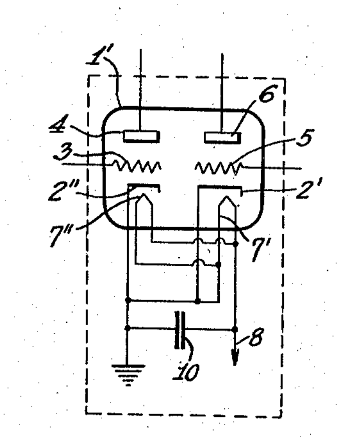

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a circuit diagram of an oscillator and mixer circuit in accordance with the present invention illustrated in connection with an AM-FM superheterodyne receiver; and Figure 1*a* is a modification of a portion of Figure 1 showing separate cathodes for the mixer triode and oscillator triode.

Referring now to Figure 1, the converter comprises a twin triode 1 which may have a common cathode 2 as illustrated. Twin triode 1 preferably is of the 6J6 type. Twin triode 1 further comprises control grid 3 and anode 4 which, together with cathode 2, form the triode mixer. Control grid 5, anode 6 and cathode 2 form the triode oscillator of the converter circuit. Common cathode 2 is grounded as illustrated and its cathode heater 7 has one terminal grounded while its other terminal 8 is connected to a suitable source of heater supply voltage. R. F. bypass capacitor 10 shunts the two cathode heater terminals.

Thus, heater chokes are made unnecessary in the leads of cathode heater 7 and accordingly there is no hum modulation of the oscillation frequency due to variations of the capacitance between cathode heater 7 and cathode 2.

A suitable antenna for the interception of AM waves, such as loop antenna 12, is coupled to mixer grid 3. Loop antenna 12 has one terminal grounded and may be tuned by tuning capacitor 13 connected across the terminals of antenna 12. Tuning capacitor 13 may be shunted by trimmer capacitor 14. The high alternating potential terminal of loop antenna 12 is coupled to mixer grid 3 through series coil 15, the movable arm of single-pole double-throw switch 16 and coupling capacitor 17. Mixer grid 3 is also connected to a source of automatic volume control voltage (AVC) through grid leak resistor 18. The AVC voltage may be derived in any conventional manner not shown.

By moving the arm of switch 16 from the position marked "AM" to the position marked "FM" a suitable antenna for the interception of FM waves such as dipole antenna 20 may be coupled to mixer grid 3. Dipole 20 has one terminal grounded through a suitable transmission line while its other terminal is connected to an intermediate point on coil 21. Tuning capacitor 22 is connected in parallel with coil 21 to provide a variable resonant circuit. Trimmer capacitor 23 may be connected in parallel with tuning capacitor 22. The connection of dipole antenna 20 to coil 21 will provide impedance matching between the radiation impedance of the dipole and the characteristic impedance of its transmission line on the one hand, and the impedance of the input circuit of the mixer triode on the other hand.

The triode oscillator circuit comprises a low frequency tank circuit 25 which may be selectively coupled to oscillator grid 5 and which is used during reception of AM waves. Tank circuit 25 consists of coil 26 and tuning capacitor 27 connected in parallel to form a parallel resonant circuit. Tuning capacitor 27 may be shunted by trimmer capacitor 28. One terminal of tank circuit 25 is grounded and its other terminal is coupled to oscillator grid 5 through coupling capacitor 30, single-pole single-throw switch 31 and resistor 32. Resistor 32 has a low resistance of the order of 10 to 100 ohms and serves the purpose of suppressing spurious oscillations. Oscillator grid 5 is returned to ground through grid leak resistor 33.

For the purposes of impressing a feedback voltage on oscillator plate 6 there is provided coil 35 having one terminal connected to a suitable anode voltage supply +B through dropping resistor 36 while its other terminal is connected to oscillator plate 6. The junction point of dropping resistor 36 and coil 35 is by-passed to ground for radio-frequency currents by capacitor 37.

Coils 26 and 35 are inductively coupled as indicated by arrow 38. Accordingly, the AM oscillator has a tuned-grid circuit with a feedback coupling provided by coil 35 between tank circuit 25 and the oscillator anode 6. The oscillator functions in a conventional manner, and its operation requires no explanation. The oscillatory energy developed in tank circuit 25 is impressed upon mixer grid 3 through series coil 15 inductively coupled to coils 26 and 35 as indicated by arrow 38.

For FM operation the oscillator comprises a high frequency tank circuit 40 which includes coil 41 having one terminal coupled to oscillator grid 5 through coupling capacitor 42 while its other terminal is coupled to oscillator plate 6 through coupling capacitor 43. Coils 41 and 21 are inductively coupled as indicated by arrow 39. An intermediate point of coil 41 is grounded through capacitor 44. The lower portion 45 of coil 41, that is, the portion effectively between capacitor 44 and oscillator anode 6 is shunted by tuning capacitor 47 across which trimmer capacitor 49 may be connected.

Mixer anode 4 is serially connected to the primary windings of FM intermediate-frequency transformer 50, shown in block form, and to AM intermediate-frequency transformer 51. Both the +B voltage and the AVC voltage are applied to transformers 50 and 51. The transformers may be selectively operated by a single-pole double-throw switch 52 which is connected to short-circuit the primary winding of the transformer not in use.

The oscillator and mixer circuit of the invention operate as follows. Let it be assumed that switches 16, 31 and 52 are in the position illustrated in the drawing, that is, in their "AM" position. Preferably, switches 16, 31 and 52 are connected together for unicontrol. The receiver is now arranged to receive AM waves which are intercepted by loop antenna 12 and impressed upon mixer grid 3. Preferably, tuning capacitors 13, 22, 27 and 47 are connected together for unicontrol as indicated at 54. Accordingly, antenna input circuit 12, 13, 14 may be tuned to a desired AM station. Low-frequency tank circuit 25 is also tuned to develop oscillatory energy of predetermined frequency which is impressed through inductive coupling upon series coil 15 so that both the local oscillations and the AM wave are impressed upon mixer grid 3. The AM wave at the intermediate frequency may be obtained from output terminal 55.

Series coil 15 performs a number of functions. Thus, most of the oscillatory energy is impressed upon mixer grid 3 and very little appears across the antenna. This is due to the fact that the grid terminal of series coil 15 is effectively isolated from ground, since the ground path includes only the comparatively small interelectrode capacitance between mixer grid 3 and cathode 2. The antenna terminal of series coil 15 is effectively bypassed to ground through tuning capacitor 13 and trimmer capacitor 14 which are both large compared to the interelectrode capacitance. Thus, the major portion of the oscillatory energy appears on mixer grid 3 and only a negligible portion is radiated into space through loop antenna 12. Accordingly, less oscillatory output energy is required because almost no energy is lost. In view of the more efficient coupling between the oscillator and the mixer, the oscillator output energy which is impressed on mixer grid 3 is more uniform over the entire AM range.

Furthermore, series coil 15 effectively functions as a low pass R.-F. filter. Thus, for high frequency waves, the reactive impedance of coil 15 is relatively high while the reactive impedance of the interelectrode capacitance between mixer grid 3 and cathode 2 is relatively small. Consequently, the high frequency voltage applied to the grid is effectively reduced. If this were not done, the high-frequency waves might beat with a harmonic of the fundamental oscillatory energy to provide an undesired output wave of intermediate-frequency.

Let it now be assumed that switches 16, 31 and 52 are rotated into their "FM" positions. In that case, dipole antenna 20 and its tuned input circuit 21, 22, 23 is coupled to mixer grid 4 to impress an intercepted FM wave on the mixer. Tuning capacitor 22 is moved in unison with capacitor 47 to select the desired FM wave. At the same time, low-frequency tank circuit 25 is disconnected from oscillator grid 5 so that only high-frequency tank circuit 40 remains connected thereto. In this case, coil 35 no longer functions as the feedback coil for low-frequency tank circuit 25 but it is now used as a choke coil for the parallel-feed +B supply. This change of function is accomplished without switching.

The FM oscillator may be considered a modified Colpitts oscillator. Thus, the junction point (ground) of capacitors 44 and 47 is connected to cathode 2. The portion 48 of coil 41 which is between the tap and mixer grid 5 functions as a feedback coil to the oscillator grid 5 since coil 41 is an autotransformer. A circuit of this type will have a substantially uniform output energy over its range. The value of capacitor 44 is selected so that for low frequencies it has a comparatively high reactive impedance so that the oscillator functions essentially in the manner of a Colpitts oscillator. However, for high frequencies the reactive impedance of capacitor 44 decreases while that of feedback coil portion 48 increases. Consequently, the oscillator functions at high frequencies as a tuned-plate circuit with a grid feedback. The FM output wave at the intermediate frequency may also be derived from output terminal 55.

Referring now to Figure 1*a*, which is a modification of that portion of Figure 1 enclosed by a dotted rectangle, separate cathodes 2′ and 2″ are provided in the oscillator circuit and mixer circuit respectively. The cathodes are directly connected to ground. The cathode heaters 7′ and 7″ are connected in parallel, each having one terminal grounded while the other terminal 8 is connected to a suitable source of heater supply voltage. Tube 1′ may be of the 6SN7 type.

While it will be understood that the circuit specifications of the frequency converter of the invention may vary according to the design for any particular application, the following circuit specifications are included by way of example only:

| | |
|---|---|
| Twin triode 1 | Type 6J6 |
| Tuning capacitor 13 | 12.5 to 498 micromicrofarads |
| Trimmer capacitor 14 | 2 to 17 micromicrofarads |
| Tuning capacitor 22 | 7 to 28 micromicrofarads |
| Trimmer capacitor 23 | 2 to 17 micromicrofarads |
| Coupling capacitor 17 | 1,500 micromicrofarads |
| Tuning capacitor 27 | 9 to 180 micromicrofarads |
| Trimmer capacitor 28 | 2 to 17 micromicrofarads |
| Coupling capacitor 30 | 150 micromicrofarads |
| Tuning capacitor 47 | 7.5 to 22.5 micromicrofarads |
| Capacitor 44 | 56 micromicrofarads |
| Coupling capacitor 42 | 22 micromicrofarads |
| Capacitor 43 | 68 micromicrofarads |
| Capacitor 49 | 2 micromicrofarads |
| Capacitor 37 | .01 microfarad |
| Resistor 18 | 3,900,000 ohms |
| Resistor 33 | 22,000 ohms |
| Resistor 36 | 27,000 ohms |
| Resistor 32 | 100 ohms |

It is to be understood that the frequency converter circuit of the invention need not be used for an AM-FM receiver, but may be used for any multirange superheterodyne receiver.

There has thus been described an oscillator and mixer circuit which may be used, for example, in an AM-FM receiver. The oscillator and mixer circuit utilizes two triodes with grounded cathodes. Accordingly, the inherently low signal-to-noise ratio of a triode mixer is utilized. The oscillator is arranged in such a manner that its output energy is substantially uniform over both its frequency ranges. Furthermore, radiation of the oscillatory energy is minimized, and a low pass filter is provided between the AM antenna and the mixer to prevent the occurrence of undesired intermediate-frequency waves. The oscillator and mixer circuit of the present invention has a simplified design, it is cheaper in manufacture and it has an improved performance.

What is claimed is:

1. In a multiband superheterodyne receiver, a twin triode having a single cathode, a first and a second anode, a first and a second control grid, said single cathode being connected to a point of common reference potential, a low-frequency resonant tank circuit, switching means for selectively connecting said low-frequency tank circuit between said first anode and said first control grid, a high-frequency resonant tank circuit permanently coupled between said first anode and said first control grid, a first means including a capacitor having a large value relative to the grid-to-cathode capacitance of said second grid and said cathode and an inductance element comprising a circuit resonant at a frequency below the resonant frequency of said low-frequency resonant tank circuit selectively connected in series arrangement between said point of common reference potential and said second control grid, for impressing a modulated carrier wave within a low-frequency range on said second grid, second means adapted to be connected to said second grid for impressing a modulated carrier wave within a high-frequency range on said second control grid, said inductance element being inductively coupled to said low-frequency tank circuit and providing in conjunction with the relatively small grid-to-cathode capacitance of said second control grid and said cathode a highly effective coupling between said low-frequency resonant tank circuit and said second control grid and in conjunction with said capacitor to minimize the coupling between said low-frequency resonant tank circuit and said first means, and an output circuit coupled to said second anode.

2. In a superheterodyne receiver, a triode mixer having an anode and a control grid, a triode oscillator having an anode and a control grid, cathode means for said mixer and said oscillator, a common cathode circuit for said triode mixer and said triode oscillator directly connected between said cathode means and one terminal of a source of potential, a high-frequency tank circuit connected between said oscillator anode and control grid, a low-frequency tank circuit adapted to be selectively connected to said oscillator control grid, a tuned input circuit connected between said one terminal and said mixer grid for impressing a modulated carrier wave on said mixer grid, an inductance element serially connected between said input circuit and said mixer grid and inductively coupled to said low-frequency tank circuit, said inductance element having a reactive impedance which, for frequencies higher than that of said carrier wave, is large compared to the reactive impedance of the grid-to-cathode capacitance of said mixer, thereby providing a low pass filter between said input circuit and said mixer grid, and an output circuit connected between the other terminal of said source and said mixer anode.

3. In a superheterodyne receiver, a twin triode having a single cathode, a first and a second anode, a first and a second control grid, said single cathode being directly connected to one terminal of a source of potential, a high-frequency tank circuit connected between said first anode and said first control grid to provide a high-frequency oscillator, a low-frequency tank circuit, switch means for selectively connecting said low-frequency tank circuit to said first control grid to provide a low-frequency oscillator, a tuned input circuit including a capacitor having a large value relative to the grid-to-cathode capacitance of said second grid and said cathode coupled from said one terminal to said second grid for impressing a modulated carrier wave thereon, an inductance element having a reactive impedance which, for frequencies higher than that of said carrier wave, is large compared to the reactive impedance of the grid-to-cathode capacitance of said second grid and said cathode, said inductance element being serially connected between said input circuit and said second grid and inductively coupled to said low-frequency tank circuit, said inductance element providing a low pass filter between said input circuit and said second grid and also functioning in conjunction with ther relatively small grid-to-cathode capacitance of said second grid and said cathode to maximize the coupling between said low-frequency tank circuit and said second grid and in conjunction with said capacitor to minimize the coupling between said low-frequency tank circuit and said input circuit, and an output circuit connected between the other terminal of said source and said second anode for deriving a frequency-converted carrier wave.

4. In a multiband superheterodyne receiver, a triode mixer having a cathode, an anode and a control grid, a triode oscillator having a cathode, an anode and a control grid, said cathodes being directly connected to one terminal of a source of potential, a low-frequency tank circuit, a switch for selectively connecting said low-frequency tank circuit to the control grid of said oscillator, a first inductance element connected between the other terminal of said source and the anode of said oscillator and inductively coupled to said low-frequency tank circuit, a high-frequency tank circuit permanently connected to said oscillator, a grid circuit including a switch connected to said mixer grid for selectively connecting circuit means to said mixer grid for impressing a modulated carrier wave within a low-frequency range or within a high-frequency range on the control grid of said mixer, and a second inductance element selectively connected in series with the grid circuit of said mixer and inductively coupled to said low-frequency tank circuit.

5. In a multiband superheterodyne receiver, a triode mixer having a cathode, an anode and a control grid, a triode oscillator having a cathode, an anode and a control grid, said cathodes being directly connected to one terminal of a source of potential, a low-frequency tank circuit, a switch for selectively connecting said low-frequency tank circuit to the control grid of said oscillator, a first inductance element connected between the other terminal of said source and the anode of said oscillator and inductively coupled to said low-frequency tank circuit, a high-frequency tank circuit permanently connected between the control grid and the anode of said oscillator, a first mixer grid input circuit, a second mixer grid input circuit and a further switch for selectively impressing a modulated carrier wave within a low-frequency range or within a high-frequency range on the control grid of said mixer through said input circuits selectively, a second inductance element serially connected in said first mixer grid input circuit and inductively coupled to said low-frequency tank circuit, and an output circuit coupled to the anode of said mixer.

6. In a multiband superheterodyne receiver, a triode mixer having a cathode, an anode and a control grid, a triode oscillator having a cathode, an anode and a control grid, said cathodes being directly connected to one terminal of a source of fixed potential, a low-frequency tank circuit, a first switch for selectively connecting said low-frequency tank circuit to the control grid of said oscillator, a first inductance element connected between the other terminal of said source and the anode of said oscillator and inductively coupled to said low-frequency tank circuit, a high-frequency tank circuit permanently connected to the anode of said oscillator, a feedback winding inductively coupled to said high-frequency tank circuit and connected to the control grid of said oscillator, a first tuned input circuit, a second tuned input circuit and a second switch for selectively connecting one of said input circuits to the control grid of said mixer to impress a modulated carrier wave within a low-frequency range or within a high-frequency range thereon, a second inductance element serially connected in said first input circuit and inductively coupled to said low-frequency tank circuit, and an output circuit connected between said other terminal of said source and said mixer anode.

7. In a two-band superheterodyne receiver, a triode mixer having a cathode, a control grid, and an anode, a triode oscillator having a cathode, a control grid and an anode, a low-frequency tank circuit, a first switch means for selectively coupling said low-frequency tank circuit to said oscillator grid, a source of potential having one terminal directly connected to said cathodes, a first inductance element connected between the other terminal of said source and said oscillator anode, said first inductance element being inductively coupled to said low-frequency tank circuit, a low frequency antenna, a high frequency antenna, a connection including a second switch means for selectively connecting one of said antennas to said mixer grid, a second inductance element serially connected between said low-frequency antenna and said second switch means and inductively coupled to said low-frequency tank circuit for impressing oscillatory energy developed in said low-frequency tank circuit on said mixer grid, a high-frequency tank circuit comprising a further inductance element having one terminal coupled to said oscillator grid and having its other terminal coupled to said oscillator anode, a fixed capacitor coupling said cathodes to an intermediate point on said further inductance element, a variable capacitor connected between said other terminal of said further inductance element and said oscillator cathode for tuning said high-frequency tank circuit, said high frequency antenna connection including a third inductance element inductively coupled to said further inductance element for impressing oscillatory energy developed in said high-frequency tank circuit on said mixer grid, and an output circuit connected between said other terminal of said source and said mixer anode.

8. In a two-band superheterodyne receiver, a triode mixer having a cathode, a control grid, and an anode, a triode oscillator having a cathode, a control grid and an anode, a low-frequency tank circuit, a first switch means for selectively coupling said low-frequency tank circuit to said oscillator grid, a source of potential having one terminal directly connected to said cathodes, a first inductance element connected between the other terminal of said source and said oscillator anode, said first inductance element being inductively coupled to said low frequency tank circuit, a low frequency antenna, a high frequency antenna, a first tuned input circuit, a second tuned input circuit, a second switch means for selectively connecting one of said antennas to said mixer grid, a second inductance element serially connected between said first input circuit and said second switch means and inductively coupled to said low-frequency tank circuit for impressing oscillatory energy developed in said low frequency tank circuit on said mixer grid, a high-frequency tank circuit comprising a further inductance element having one terminal coupled to said oscillator grid and having its other terminal coupled to said oscillator anode, a fixed capacitor coupling an intermediate point of said further inductance element to said cathodes, a variable capacitor connected between said other terminal of said further inductance element and said oscillator cathode for tuning said high-frequency tank circuit, said second input circuit including a third inductance element inductively coupled to said further inductance element for impressing oscillatory energy developed in said high-frequency tank circuit on said mixer grid, and an output circuit connected between said other terminal of said source and said mixer anode.

BENJAMIN S. VILKOMERSON.

REFERENCES CITED

The following references are of record in the file of this patent:

UNITED STATES PATENTS

| Number | Name | Date |
|---|---|---|
| 2,011,941 | Snider | Aug. 20, 1935 |
| 2,038,918 | Bailey | Apr. 28, 1936 |
| 2,289,147 | Shea | July 7, 1942 |
| 2,295,383 | Carlson | Sept. 8, 1942 |
| 2,355,470 | Root | Aug. 8, 1944 |
| 2,443,935 | Shea | June 22, 1948 |